(12) United States Patent
Hattis et al.

(10) Patent No.: US 12,123,897 B2
(45) Date of Patent: Oct. 22, 2024

(54) DIELECTRIC RESONATING TEST CONTACTOR AND METHOD

(71) Applicant: XCERRA CORPORATION, Norwood, MA (US)

(72) Inventors: James Hattis, St. Paul, MN (US); Travis Evans, St. Paul, MN (US); Waqas Muzammil, St. Paul, MN (US); Yukang Feng, St. Paul, MN (US); Jason Mroczkowski, St. Paul, MN (US); Marty Cavegn, St. Paul, MN (US)

(73) Assignee: Xcerra Corporation, Norwood, MA (US)

( * ) Notice: Subject to any disclaimer, the term of this patent is extended or adjusted under 35 U.S.C. 154(b) by 126 days.

(21) Appl. No.: 17/127,751

(22) Filed: Dec. 18, 2020

(65) Prior Publication Data
US 2021/0190821 A1    Jun. 24, 2021

Related U.S. Application Data

(60) Provisional application No. 62/989,278, filed on Mar. 13, 2020, provisional application No. 62/950,755, filed on Dec. 19, 2019.

(51) Int. Cl.
| | |
|---|---|
| *G01R 1/067* | (2006.01) |
| *G01R 1/02* | (2006.01) |
| *G01R 1/04* | (2006.01) |
| *G01R 1/073* | (2006.01) |
| *G01R 31/26* | (2020.01) |
| *G01R 31/28* | (2006.01) |
| *H01R 13/22* | (2006.01) |
| *H01R 13/405* | (2006.01) |

(52) U.S. Cl.
CPC ......... *G01R 1/067* (2013.01); *G01R 31/2886* (2013.01); *H01R 13/22* (2013.01); *H01R 13/405* (2013.01)

(58) Field of Classification Search
CPC . G01R 1/02; G01R 1/04; G01R 1/067; G01R 1/073; G01R 31/00; G01R 31/28; G01R 31/31; G01R 31/312; G01R 31/02; G01R 31/04; G01R 31/26; G01R 31/27
See application file for complete search history.

(56) References Cited

U.S. PATENT DOCUMENTS

| | | | | |
|---|---|---|---|---|
| 4,425,476 A | * | 1/1984 | Kyle | H01B 17/305 403/29 |
| 2011/0284843 A1 | * | 11/2011 | Chen | H01L 22/34 257/E23.151 |
| 2015/0091600 A1 | * | 4/2015 | Rathburn | G01R 1/0466 29/884 |

(Continued)

FOREIGN PATENT DOCUMENTS

CN    204156090    *    2/2015    ............... H01Q 1/38

*Primary Examiner* — Neel D Shah
(74) *Attorney, Agent, or Firm* — Knobbe, Martens, Olson & Bear, LLP

(57) ABSTRACT

A test contactor is disclosed. The test contactor includes two or more dielectric layers and a test probe embedded in the one or more dielectric layers. The test contactor traverses the one or more dielectric layers. The test probe to include an input signal port and an output signal port and the test probe to transmit a test signal from the input signal port to the output signal port.

17 Claims, 14 Drawing Sheets

(56) References Cited

U.S. PATENT DOCUMENTS

2016/0124020 A1\* 5/2016 Shi .................. G01R 1/06761
                                                    324/755.02
2019/0204379 A1\* 7/2019 Chen ................ G01R 1/07371
2020/0265913 A1\* 8/2020 Kim .................... H01L 23/528

\* cited by examiner

DIELECTRIC RESONATING TEST CONTACTOR AND METHOD

CROSS-REFERENCE TO RELATED APPLICATIONS

This patent application claims the benefit of priority of U.S. application Ser. No. 62/950,755, filed Dec. 19, 2019, and of U.S. application Ser. No. 62/989,278, filed Mar. 13, 2020, which applications are herein incorporated by reference.

BACKGROUND

A test contactor included in integrated circuit test systems couples a test signal from a test signal source to an integrated circuit under test. A typical test contactor includes a test probe embedded in a material having a single dielectric constant. The bandwidth of these test contactors is insufficient to transmit test signals at the frequencies required to test many high-frequency analog integrated circuits or the data rates required to test many high-frequency digital integrated circuits. For these and other reasons there is a need for the subject matter of the present disclosure.

SUMMARY

Consistent with the disclosed embodiments, a test contactor is disclosed. The test contactor comprises two or more dielectric layers and a test probe embedded in the two or more dielectric layers. The test probe traverses the two or more dielectric layers. The test probe to include an input signal port and an output signal port and the test probe to transmit a test signal from the input signal port to the output signal port. In some embodiments, one of the two or more dielectric layers includes a material having a low dielectric constant. In some embodiments, the test probe includes a ground-signal probe contact configuration.

Consistent with the disclosed embodiments, a system for testing an integrated circuit is disclosed. The system comprises a test signal source to provide a test signal, a test station for mounting the integrated circuit, and a test contactor. The test contractor includes two or more dielectric layers and a test probe. The test probe is embedded in the two or more dielectric layers and traverses the two or more dielectric layers. The test probe includes an input signal port and an output signal port, and the test probe to transmit a test signal from the input signal port to the output signal port. In some embodiments, one of the two or more dielectric layers includes a material having a medium or high dielectric constant. In some embodiments, the test probe includes a ground-signal probe contact configuration.

Consistent with the disclosed embodiments, a test contactor is disclosed. The test contactor comprises a dielectric stack, a dielectric layer, and a test probe. The dielectric layer includes a first dielectric layer, a second dielectric layer, and a third dielectric layer located between the first dielectric layer and the second dielectric layer. The test probe is embedded in the dielectric stack and traverses the dielectric stack from the first dielectric layer to the second dielectric layer. The test probe includes an input signal port and an output signal port. In operation, the test probe transmits a test signal from the input signal port to the output signal port. In some embodiments, the first dielectric layer includes a first dielectric material having a first dielectric constant, the second dielectric layer includes a second dielectric material having a second dielectric constant, and the third dielectric layer includes a third dielectric material having a third dielectric constant. In some embodiments, the third dielectric constant is less than the first dielectric constant and the second dielectric constant. In some embodiments, the first dielectric constant is a medium or high dielectric constant. In some embodiments, the test probe includes a ground-signal-ground probe contact geometry. In some embodiments, the test contactor further comprises a fourth dielectric layer located between the first dielectric layer and the third dielectric layer, and a fifth dielectric layer located between the second dielectric layer and the third dielectric layer. In some embodiments, the fourth dielectric layer includes a material having a low dielectric constant. In some embodiments, the third dielectric layer includes a material having a medium or high dielectric constant.

Consistent with the disclosed embodiments, a test contactor is disclosed. The test contactor comprises a dielectric assembly including a first dielectric stack and a second dielectric stack, the second dielectric stack having at least three dielectric layers. The test contactor comprises a first test probe embedded in the first dielectric stack. The test contactor comprises a second test probe embedded in the second dielectric stack. In some embodiments, at least one of the three dielectric layers includes a material having a medium or high dielectric constant. In some embodiments, the first test probe includes a ground-signal probe contact configuration. In some embodiments, at least one of the three dielectric layers includes a material having a low dielectric constant. In some embodiments, the second test probe includes a ground-signal-signal-ground probe contact configuration. In some embodiments, the first test probe includes a test probe pitch of between about twenty-five microns and about one thousand five hundred microns.

Consistent with the disclosed embodiments, a method for manufacturing a test contactor is disclosed. The method comprises forming a dielectric stack including at least three dielectric layers. The method comprises integrating a test probe into the dielectric stack. In some embodiments, integrating the test probe into the dielectric stack comprises machining the dielectric stack to form a space for the test probe and inserting the test probe into the space. In some embodiments, forming the dielectric stack including at least three dielectric layers comprises selecting at least one dielectric layer of the three dielectric layers to have a low dielectric constant.

Consistent with the disclosed embodiments, a system for testing an integrated circuit is disclosed. The system comprises a test signal source to provide a test signal, a test station for mounting the integrated circuit, a test contactor, and a test probe to couple the test signal to the integrated circuit. The dielectric stack includes a first dielectric layer, a second dielectric layer, and a third dielectric layer located between the first dielectric layer and the second dielectric layer. In operation, the test probe couples the test signal to the integrated circuit. The test probe is embedded in the dielectric stack and traverses the dielectric stack from the first dielectric layer to the second dielectric layer. The test probe includes an input signal port and an output signal port and in operation transmits a test signal from the input signal port to the output signal port. In some embodiments, the third dielectric layer includes a material having a medium or high dielectric constant. In some embodiments, the test probe includes a ground-signal probe contact configuration. The test system further comprises a fourth dielectric layer located between the first dielectric layer and the third dielectric layer and a fifth dielectric layer located between the second dielectric layer and the third dielectric layer. In some embodiments, the test signal includes a frequency of between about dc and about one hundred gigahertz.

Consistent with the disclosed embodiments, a method for testing an integrated circuit is disclosed. The method comprises mounting the integrated circuit on a test station. The method comprises generating a test signal. The method comprises coupling the test signal through a test probe embedded in a dielectric stack, including at least three dielectric layers, to the integrated circuit. In some embodiments, the integrated circuit generates the test signal. In some embodiments, generating the test signal comprises generating the test signal with a frequency of between about dc and about one hundred gigahertz.

Consistent with the disclosed embodiments, a system for testing an integrated circuit is disclosed. The system includes a test signal source to provide a test signal, a test station for mounting the integrated circuit, and a test contactor. The test contactor further comprises two or more dielectric layers, and a test probe embedded in the two or more dielectric layers. The test probe traverses the two or more dielectric layers. The test probe to include an input signal port and an output signal port and the test probe to transmit the test signal from the input signal port to the output signal port. In some embodiments, one of the two or more dielectric layers includes a material having a medium or high dielectric constant. In some embodiments, the test probe includes a ground-signal probe contact configuration.

Consistent with the disclosed embodiments, a test contactor is disclosed. The test contactor includes a first plate, a second plate, and one or more dielectric layers formed between the first plate and the second plate. The test probe is embedded in the first plate. The test probe is embedded in the one or more dielectric layers. The test probe is embedded in the second plate. The test probe traverses the first plate, the one or more dielectric layers, and the second plate. The test probe to include an input signal port and an output signal port and the test probe to transmit a test signal from the input signal port to the output signal port. In some embodiments, one of the one or more dielectric layers includes a material having a low dielectric constant. In some embodiments, the test probe includes a ground-signal probe contact configuration.

Consistent with the disclosed embodiments a test contactor is disclosed. The test contact includes a dielectric material stack up engineered for optimized radio frequency performance, mechanical robustness, and manufacturing efficiency.

Consistent with the disclosed embodiments a test contactor is disclosed. The test contactor includes a dielectric material stack up including a plurality of dielectric materials, each of the plurality of dielectric materials having a thickness engineered for optimized radio frequency performance, mechanical robustness, and manufacturing efficiency.

Consistent with the disclosed embodiments, a design process for a contactor including two or more dielectric layers and having a contactor radio frequency performance, given a radio frequency performance design goal is disclosed. The design process includes selecting a hole diameter for a probe traversing the two or more dielectric layers and stopping the design process if the contactor radio frequency performance meets the radio frequency performance design goal. The design process includes selecting a new material and a new thickness for one of the two or more dielectric layers and stopping the design process if the contactor radio frequency performance meets the radio frequency performance design goal. And the design process includes adding a new dielectric layer to the contactor, the new dielectric layer having a new dielectric layer dielectric constant and a new dielectric layer thickness, and stopping the design process if the radio frequency performance of the contactor meets the radio frequency performance design goal.

DESCRIPTION

Reference will now be made in detail to the exemplary embodiments of the present disclosure described below and illustrated in the accompanying drawings. Wherever possible, the same reference numbers will be used throughout to refer to same or like parts.

While the present invention is described herein with reference to illustrative embodiments for particular applications, it should be understood that the invention is not limited thereto. Those having ordinary skill in the art and access to the teachings provided herein will recognize additional modifications, applications, embodiments, and substitution of equivalents, that all fall within the scope of the disclosure. Accordingly, the disclosure is not to be considered as limited by the foregoing or following descriptions.

Figure 1A:
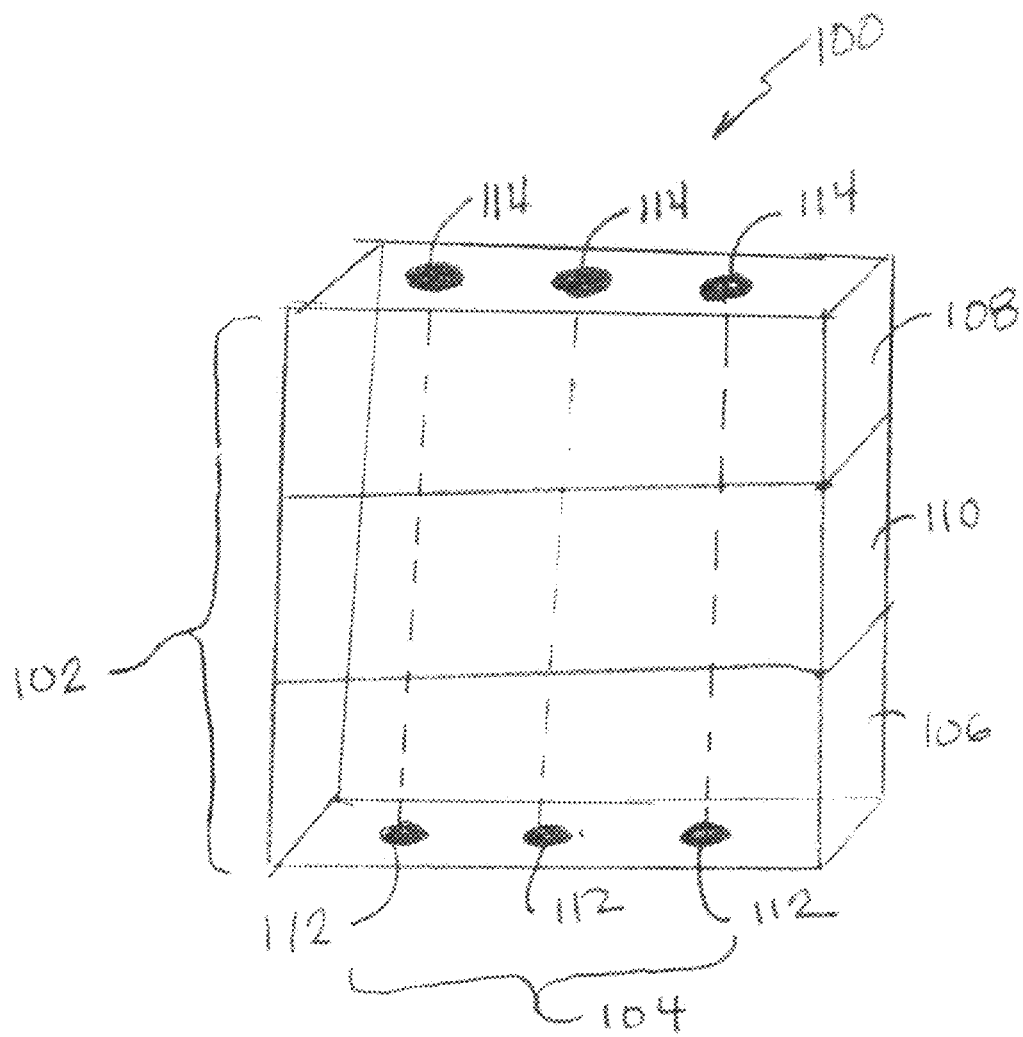
FIG. 1A shows a schematic illustration of a test contactor including a dielectric stack and a test probe embedded in the dielectric stack in accordance with some embodiments of the present disclosure.

FIG. 1A shows a schematic illustration of a test contactor 100 including a dielectric stack 102 and a test probe 104 embedded in the dielectric stack 102 in accordance with some embodiments of the present disclosure. The dielectric stack 102 includes a first dielectric layer 106, a second dielectric layer 108, and a third dielectric layer 110. The third dielectric layer 110 is located between the first dielectric layer 106 and the second dielectric layer 110. A low dielectric constant is between about one and about three. A medium dielectric constant is between about three and about six. A high dielectric constant is greater than about six. Materials having a medium or high dielectric constant are used in the fabrication of the first dielectric layer 106, the second dielectric layer 108 and the third dielectric layer 110.

In some embodiments, machinable ceramics are used in the fabrication of one or more of the first dielectric layer 106, the second dielectric layer 108, and the third dielectric layer 110. A test probe includes one or more signal conductors and one or more ground conductors to deliver a test signal to an integrated circuit under test. The test probe 104 includes an input signal port 112 and an output signal port 114. Those skilled in the art will appreciate that the input signal port 112 and the output signal port 114 may include both signal conductors and ground conductors. The test probe 104 traverses the dielectric stack 102 from the first dielectric layer 106 to the second dielectric layer 108. The test probe 104 is not limited to a particular probe contact configuration. In some embodiments, the test probe 104 has a ground-signal-ground probe contact configuration. In operation, the test probe 104 transmits a test signal from the input signal port 112 to the output signal port 114.

In the test contactor 100 shown in FIG. 1A, the first dielectric layer 106 includes a first dielectric material having a first dielectric constant, the second dielectric layer 108 includes a second dielectric material having a second dielectric constant, and the third dielectric layer 110 includes a third dielectric material having a third dielectric constant. A dielectric constant is a numerical measure of the ability of a material to isolate charges from one another and is representative of the permittivity of a substance when compared to a vacuum. In some embodiments, the third dielectric constant is less than the first dielectric constant and the second dielectric constant. In some embodiments, the first dielectric constant is a medium dielectric constant. A medium dielectric constant has a value of between about three and about six. In some embodiments, the electrical performance of the test contactor 100 is optimized at various pitches of the test probe 104 to use thicker or thinner materials having different dielectric constant for the first dielectric layer 106, the second dielectric layer 108, and the third dielectric layer 110.

Figure 1B:
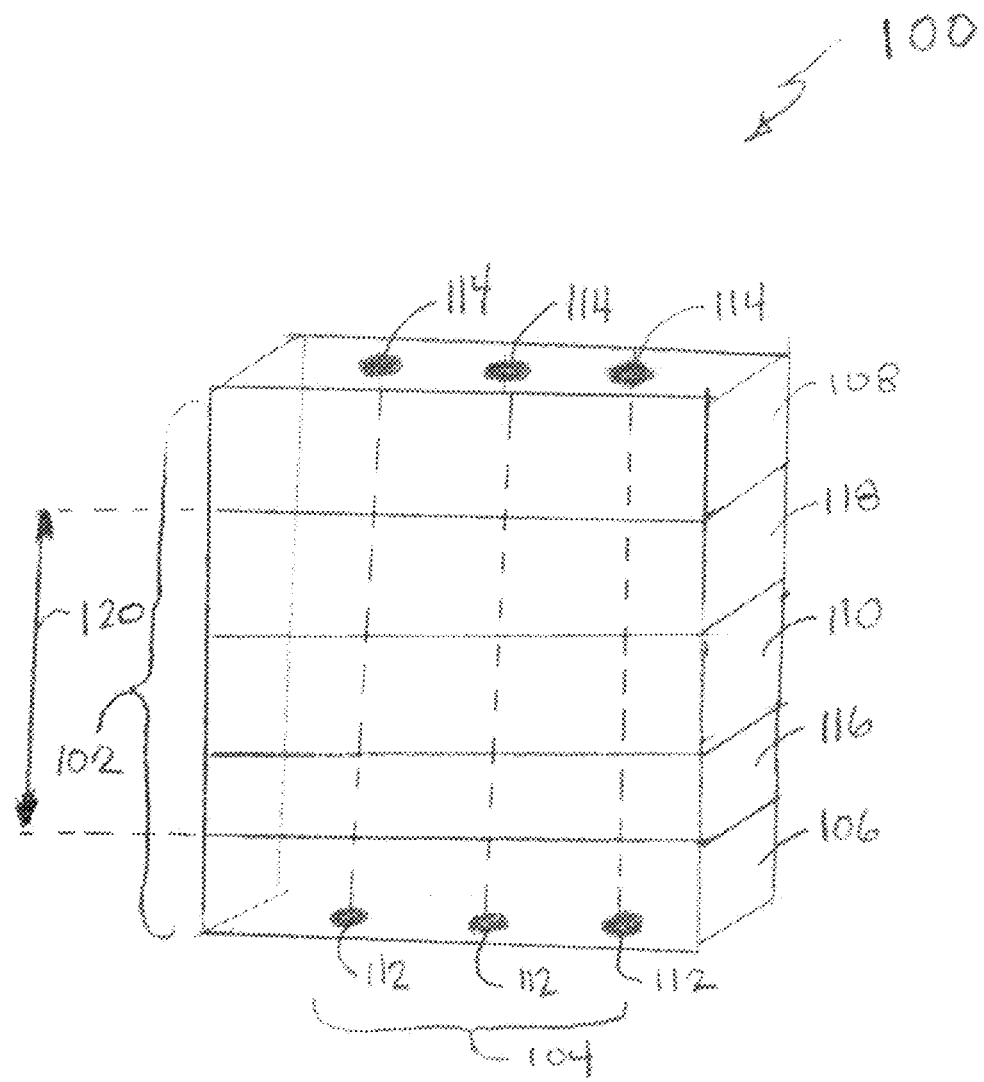
FIG. 1B shows a schematic illustration of the test contactor shown in FIG. 1A and further including a fourth dielectric layer and a fifth dielectric layer in accordance with some embodiments of the present disclosure.

FIG. 1B shows a schematic illustration of the test contactor 100 shown in FIG. 1A and further including a fourth dielectric layer 116 and a fifth dielectric layer 118 in accordance with some embodiments of the present disclosure. The fourth dielectric layer 116 is located between the first dielectric layer 106 and the third dielectric layer 110. The fifth dielectric layer 118 is located between the second dielectric layer 108 and the third dielectric layer 110. In some embodiments, the fourth dielectric layer 116 includes a material having a low dielectric constant. A low dielectric constant has a value of between about one and about three. In some embodiments, the fifth dielectric layer 118 includes a material having a medium or high dielectric constant. A medium dielectric constant has a value of between about three and about six. A high dielectric constant has a value of greater than about six.

The dielectric stack 102 includes a distance 120 between the first dielectric layer 106 and the second dielectric layer 108. The distance 120 is probe dependent and pitch dependent. In some embodiments, the distance 120 is between about one-eighth and about seven-eighths of a wavelength of the test signal transmitted by the test contactor 100.

In some embodiments, a test contactor includes a dielectric material stack up engineered for optimized radio frequency performance, mechanical robustness, and manufacturing efficiency either separately or combined. The dielectric material stack up is engineered for optimized radio frequency performance by matching the impedance of the contactor to the specification for a device to be tested, providing a low insertion loss, and providing low reflection. The dielectric material stack up is engineered for mechanic robustness by engineering the dielectric material stack up for increased stiffness, wear resistance, durability, and life-time. The dielectric material stack up is engineered for manufacture efficiency by engineering for through put, cost, and lead time.

In some embodiments, a test contactor includes a dielectric material stack up including a plurality of dielectric materials, each of the plurality of dielectric materials having a thickness engineered for optimized radio frequency performance, mechanical robustness, and manufacturing efficiency either separately or combined. The plurality of dielectric materials is engineered for optimized radio frequency performance by matching the impedance of the contactor to the specification for a device to be tested, providing a low insertion loss, and providing low reflection. The plurality of dielectric materials is engineered for mechanic robustness by engineering the dielectric material stack up for increased stiffness, wear resistance, durability, and life-time. The plurality of dielectric materials is engineered for manufacture efficiency by engineering for through put, cost, and lead time.

Figure 2:
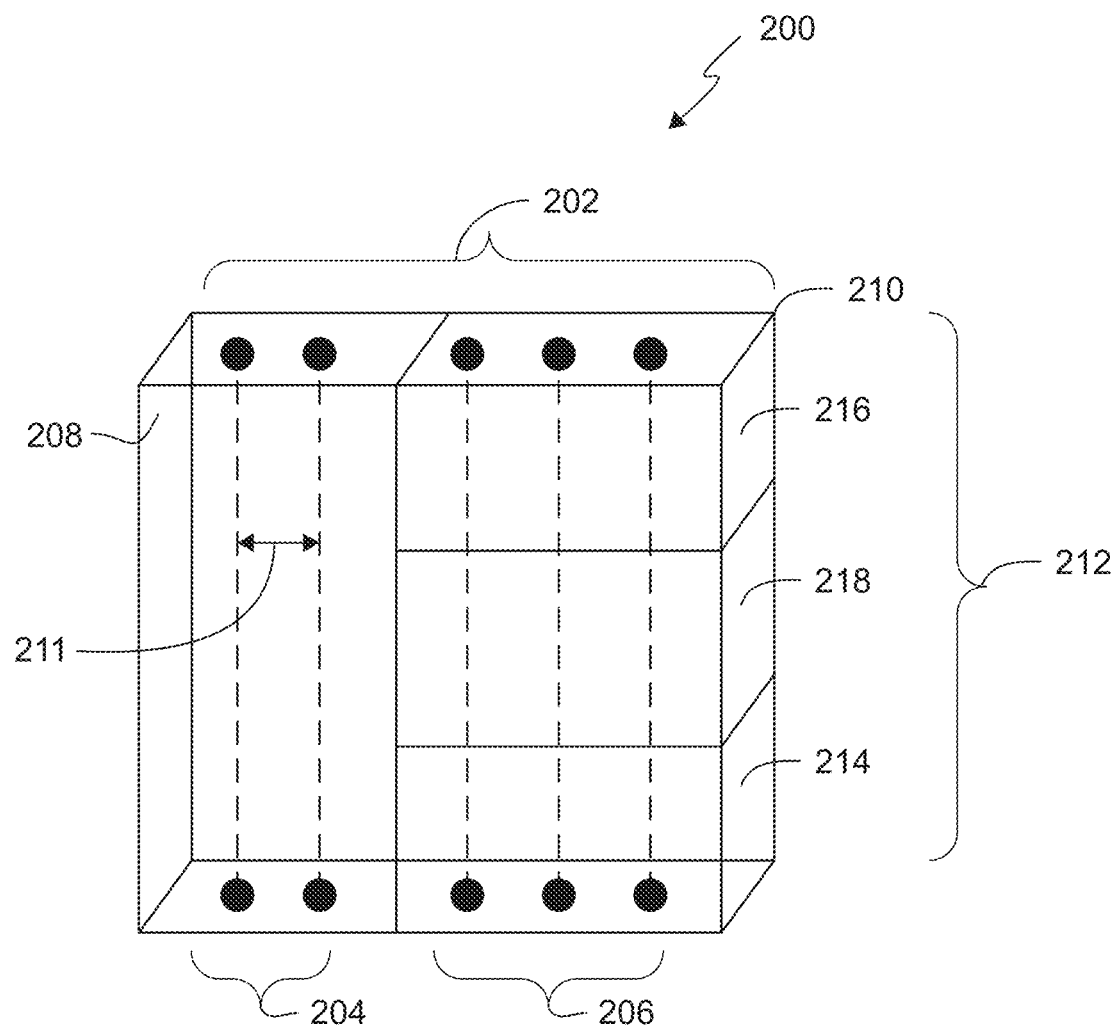
FIG. 2 shows a schematic illustration of a test contactor in accordance with some embodiments of the present disclosure.

FIG. 2 shows a schematic illustration of a test contactor 200 in accordance with some embodiments of the present disclosure. The test contactor 200 includes a dielectric assembly 202, a first test probe 204, and a second test probe 206. The dielectric assembly 202 includes a first dielectric stack 208 and a second dielectric stack 210. The first dielectric stack 208 is formed from a single dielectric material.

The first test probe 204 is embedded in the first dielectric stack 208. In some embodiments, the first test probe 204 includes a ground-signal probe contact configuration. The first test probe 204 includes a test probe pitch 211. The test probe pitch is the distance between the conductors in a test probe, for example, the distance between a ground conductor and a signal conductor in a ground-signal test probe contact configuration. The test probe pitch 211 is not limited to a particular distance. In some embodiments, the test probe pitch 211 is between about twenty-five microns and about one thousand five hundred microns. In some embodiments, the test probe pitch 211 is between about twenty-five microns and about five hundred microns. In some embodiments, the test probe pitch 211 is between about five hundred microns and about one thousand microns. In some embodiments, the test probe pitch 211 is between about one thousand microns and about one thousand five hundred microns.

The second test probe 206 is embedded in the second dielectric stack 210. In some embodiments, the second test probe 206 includes a ground-signal-ground probe contact configuration.

The second dielectric stack has at least three dielectric layers 212, including a first dielectric layer 214, a second dielectric layer 216, and a third dielectric layer 218. In some embodiments, at least one of the at least three dielectric layers 212, for example, the first dielectric layer 214, includes a material having a medium or high dielectric constant. A medium dielectric constant has a value of between about three and about six. A high dielectric constant has a value of greater than about six. In some embodiments, at least one of the three dielectric layers 212 includes a material having a low dielectric constant. A low dielectric constant is a dielectric constant of between about one and about three.

Figure 3:
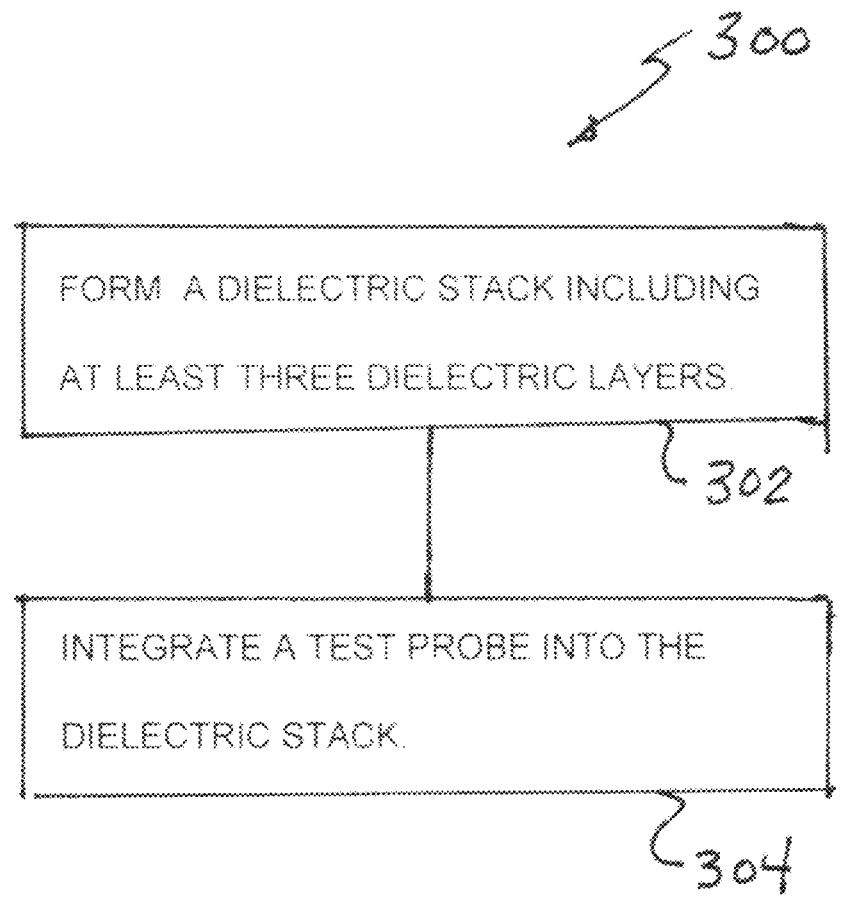
FIG. 3 shows a flow diagram of a method for manufacturing a test contactor in accordance with some embodiments of the present disclosure.

FIG. 3 shows a flow diagram of a method 300 for manufacturing a test contactor in accordance with some embodiments of the present disclosure. The method 300 includes forming a dielectric stack including at least three dielectric layers (block 302) and integrating a test probe into the dielectric stack (block 304). In some embodiments, integrating the test probe into the dielectric stack includes machining the dielectric stack to form a space for the test probe and inserting the test probe into the space. In some embodiments, forming the dielectric stack including at least three dielectric layers comprises selecting at least one dielectric layer of the three dielectric layers to have a low dielectric constant. A low dielectric constant is a dielectric constant having a value of between about one and about three.

Figure 4:
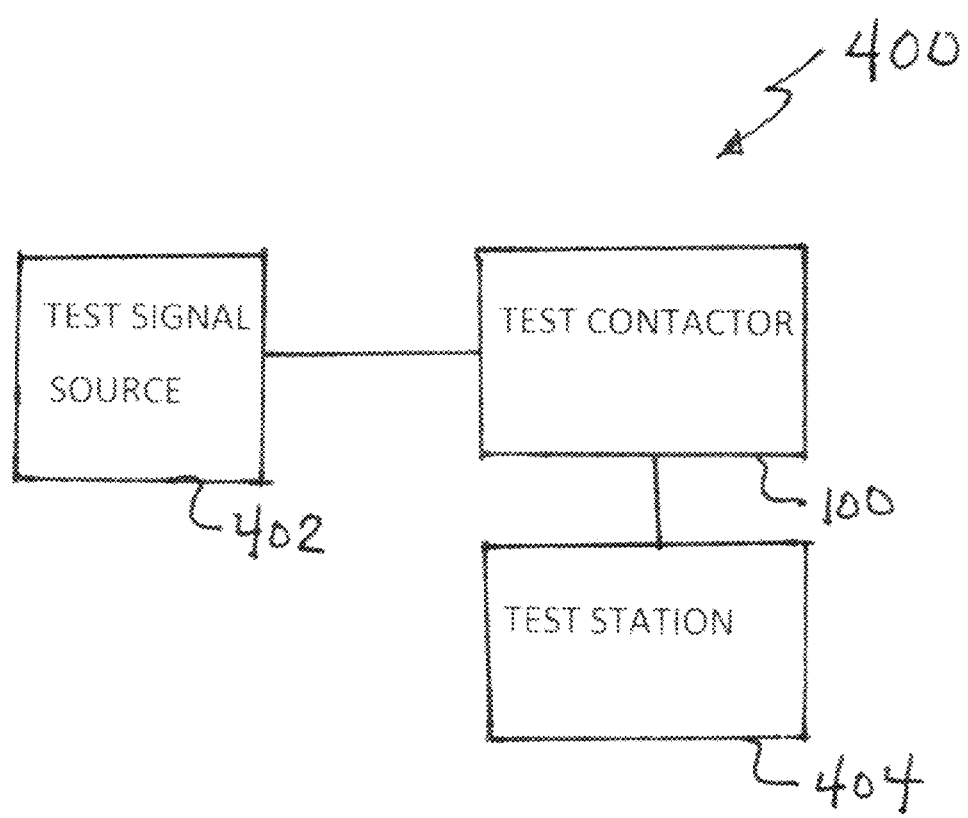
FIG. 4 shows a block diagram of a system for testing an integrated circuit in accordance with some embodiments of the present disclosure.

FIG. 4 shows a block diagram of a system 400 for testing an integrated circuit in accordance with some embodiments of the present disclosure. The system 400 includes a test signal source 402 to provide a test signal, a test station 404 for mounting the integrated circuit, and a test contactor 100 (shown in FIG. 1A). In some embodiments, the third dielectric layer 110 (shown in FIG. 1A) includes a material having a medium dielectric constant. A medium dielectric constant is a dielectric constant between about two and about four. In some embodiments, the test probe 104 (shown in FIG. 1A) includes a ground-signal probe contact configuration. In some embodiments, the test contactor 100 (shown in FIG. 1A) further includes a fourth dielectric layer 116 (shown in FIG. 1B) located between the first dielectric layer 106 (shown in FIG. 1B) and the third dielectric layer 110 (shown in FIG. 1B) and a fifth dielectric layer 118 (shown in FIG. 1B) located between the second dielectric layer 108 (shown in FIG. 1B) and the third dielectric layer 110 (shown in FIG. 1B). In some embodiments, the test signal includes a frequency of between about dc and about one hundred gigahertz. In some embodiments, the test signal includes a frequency of between about dc and about thirty gigahertz. In some embodiments, the test signal includes a frequency of between about thirty gigahertz and about forty-five gigahertz. In some embodiments, the test signal includes a frequency of between about forty-five gigahertz and about sixty-five gigahertz. In some embodiments, the test signal includes a frequency of between about sixty-five gigahertz and about one hundred gigahertz.

Figure 5:
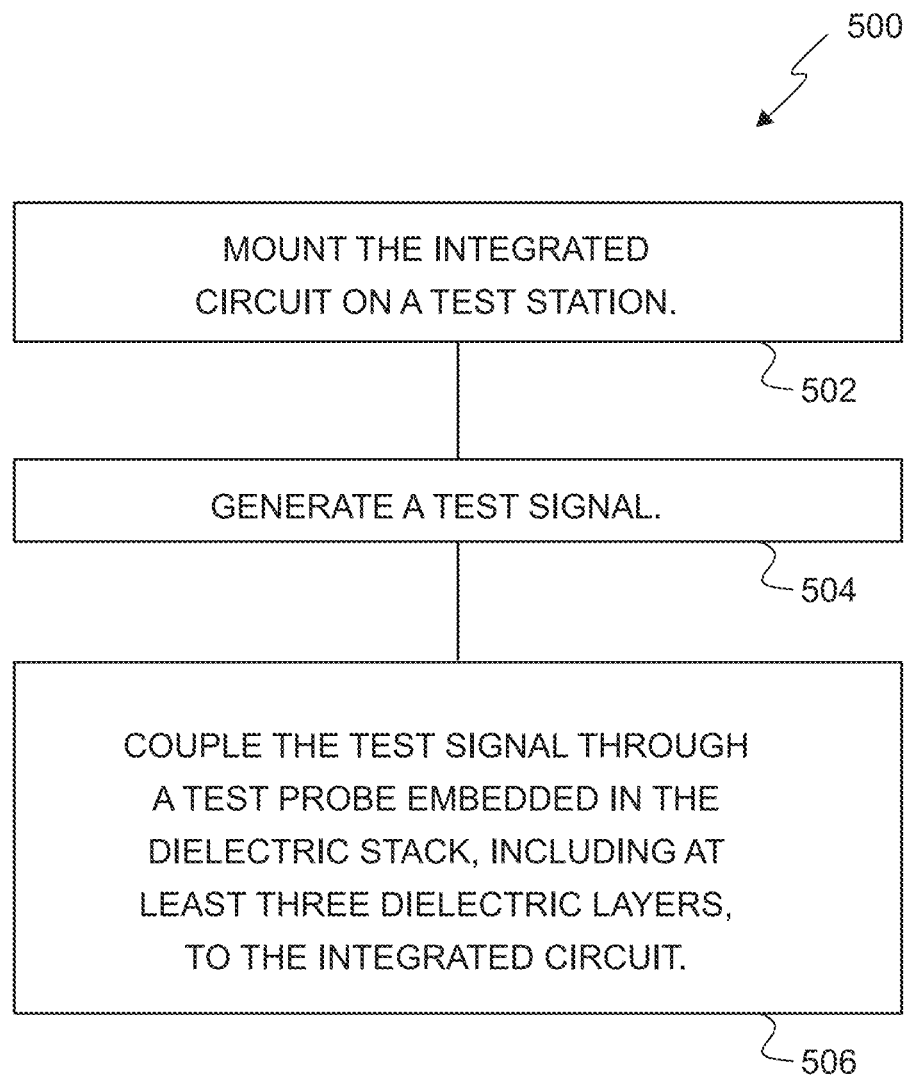
FIG. 5 shows a flow diagram of a method for testing an integrated circuit in accordance with some embodiments of the present disclosure.

FIG. 5 shows a flow diagram of a method 500 for testing an integrated circuit in accordance with some embodiments of the present disclosure. The method includes mounting the integrated circuit on a test station (block 502), generating a test signal (block 504), and coupling the test signal through a test probe embedded in a dielectric stack, including at least three dielectric layers, to the integrated circuit (block 506). In some embodiments, the integrated circuit generates the test signal. In some embodiments, generating the test signal comprises generating the test signal with a frequency of between about dc and about one hundred gigahertz.

Figure 6:
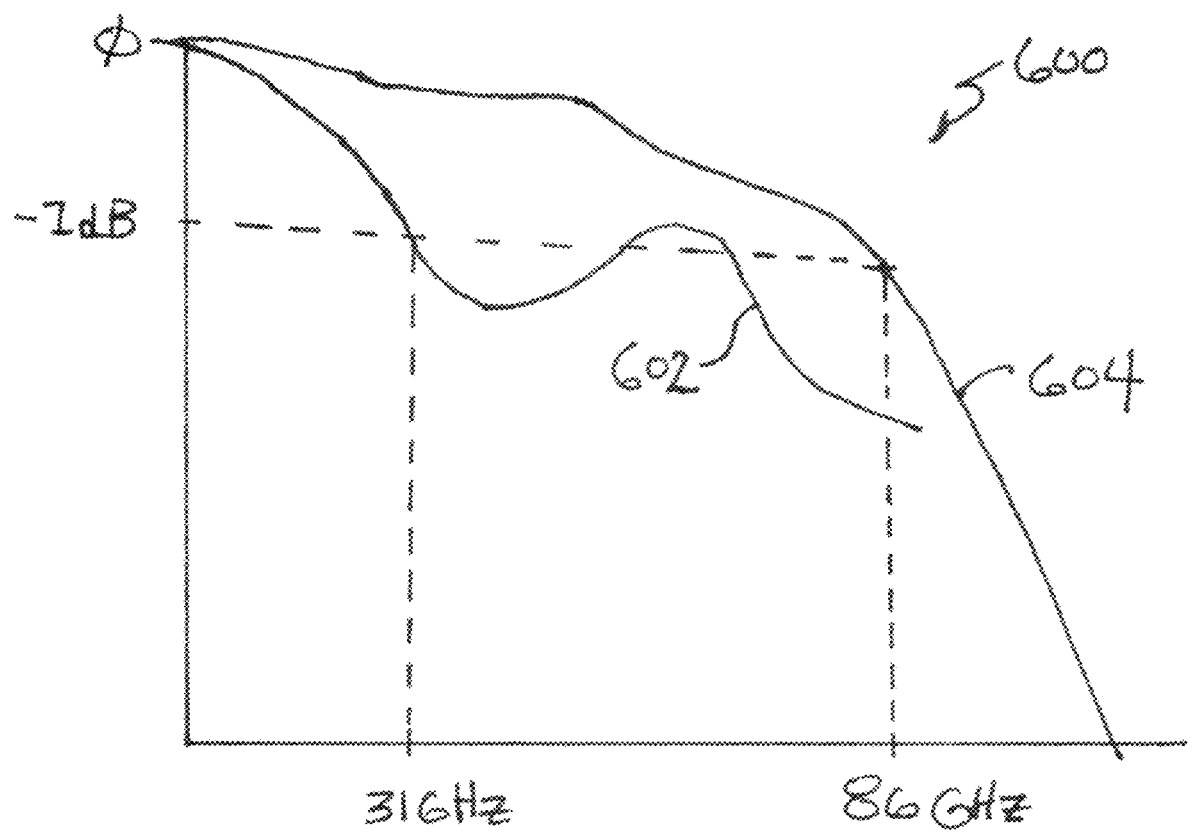
FIG. 6 shows a graph of predicted insertion loss for a single dielectric contactor and predicted insertion loss for an exemplary contactor in accordance with some embodiments of the present disclosure.

FIG. 6 shows a graph 600 of predicted insertion loss obtained from a simulation for a single dielectric contactor 602 and predicted insertion loss obtained from a simulation for an exemplary contactor 604 in accordance with the present disclosure. Insertion loss is the loss of signal power resulting from the insertion of a contactor in the path of the test signal. As can be seen in the graph 600, the insertion loss for the exemplary contactor 604 is down 1 dB at about eighty-six megahertz, while the insertion loss for the single dielectric contactor 602 is down 1 dB at about thirty-one gigahertz. A loss of 1 dB is the standard for acceptable performance of a test contactor in the semiconductor test equipment industry. Thus, there is a significant and unexpected bandwidth increase of about fifty-five gigahertz for the exemplary contactor 604 in accordance with the present disclosure when compared to the single dielectric contactor 602.

Figure 7:
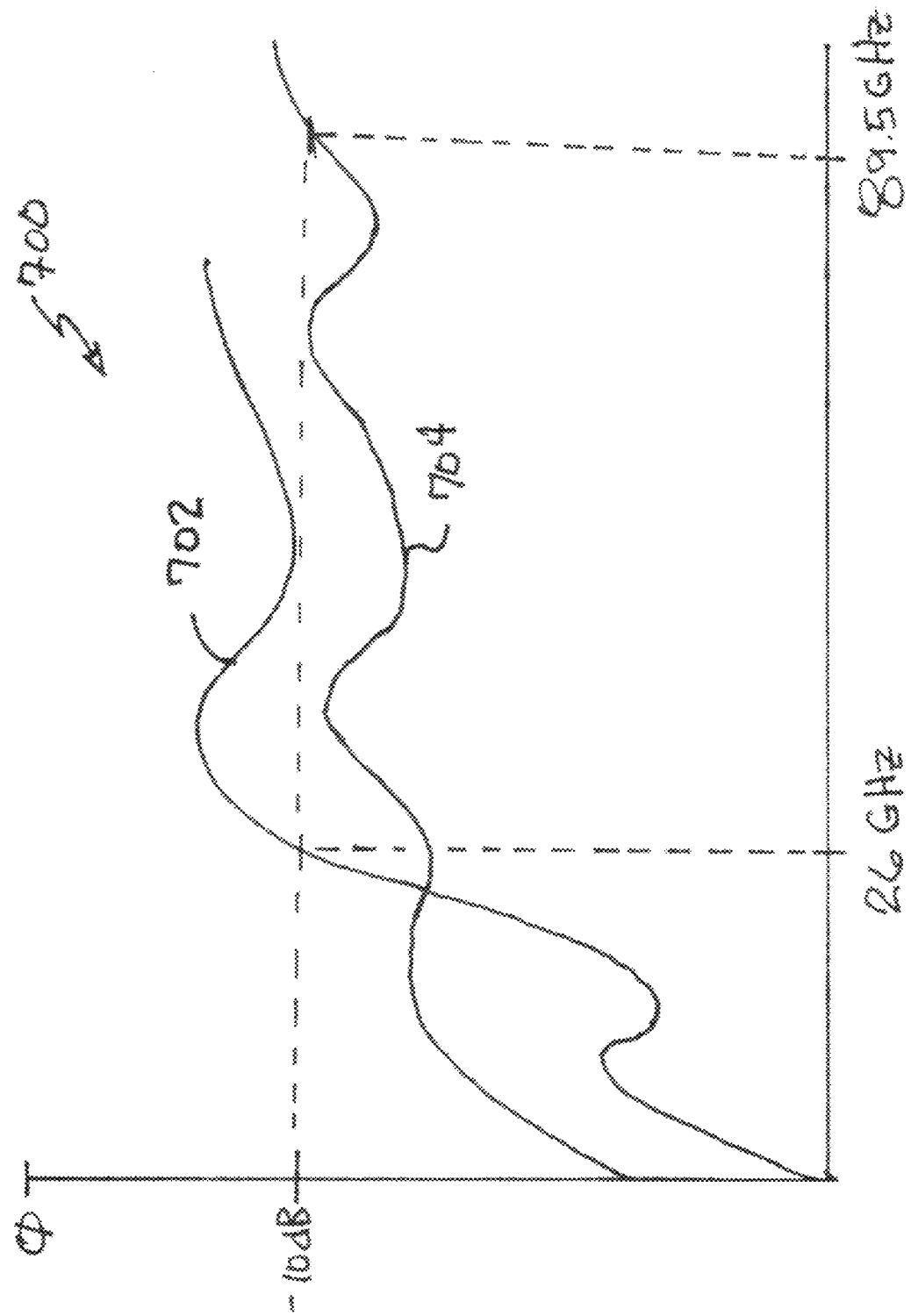
FIG. 7 shows a graph of predicted return loss for a single dielectric contactor and predicted return loss for an exemplary contactor in accordance with some embodiments of the present disclosure.

FIG. 7 shows a graph 700 of predicted return loss obtained form a simulation for a single dielectric contactor 702 and predicted return loss obtained from a simulation for an exemplary contactor 704 in accordance with the present disclosure. Return loss is the ratio of the reflected power to the incident power. As can be seen in the graph 700, the return loss for the exemplary contactor 704 is down 10 dB at about eighty-nine gigahertz, while the return loss for the single dielectric contactor 702 is down 10 dB at about thirty-six gigahertz. A return loss of 10 dB is the standard for acceptable performance of a test contactor in the semiconductor test equipment industry. Thus, there is a significant and unexpected bandwidth improvement of about fifty-three gigahertz for the exemplary contactor 704 when compared to the single dielectric contactor 702.

Comparative predictive data obtained from a simulation for the digital performance of a single dielectric contactor with the digital performance of an exemplary contactor in accordance with the present disclosure was also developed. An eye diagram was generated and distortion of a digital input signal having a data rate of fifty-six gigabits per second and a rise time of four picoseconds was extracted from the eye diagram. For the single dielectric contactor, the eye signal-to-noise ratio was 21.77, while for the exemplary contactor of the present disclosure the eye signal-to-noise ratio was 59.64. For the single dielectric contactor, the ten-to-ninety percent rise time was 10.03 picoseconds, while for the exemplary contactor of the present disclosure the ten-to-ninety percent rise time was 7.77 picoseconds. For the single dielectric contactor, the eye jitter was 0.4991 RMS, while for the exemplary contactor of the present disclosure of contactor eye jitter was 0.0930 RMS. For each measure of performance, the exemplary contactor of the present disclosure showed a significant and unexpected performance improvement when compared to a single dielectric contactor.

Figure 8A:
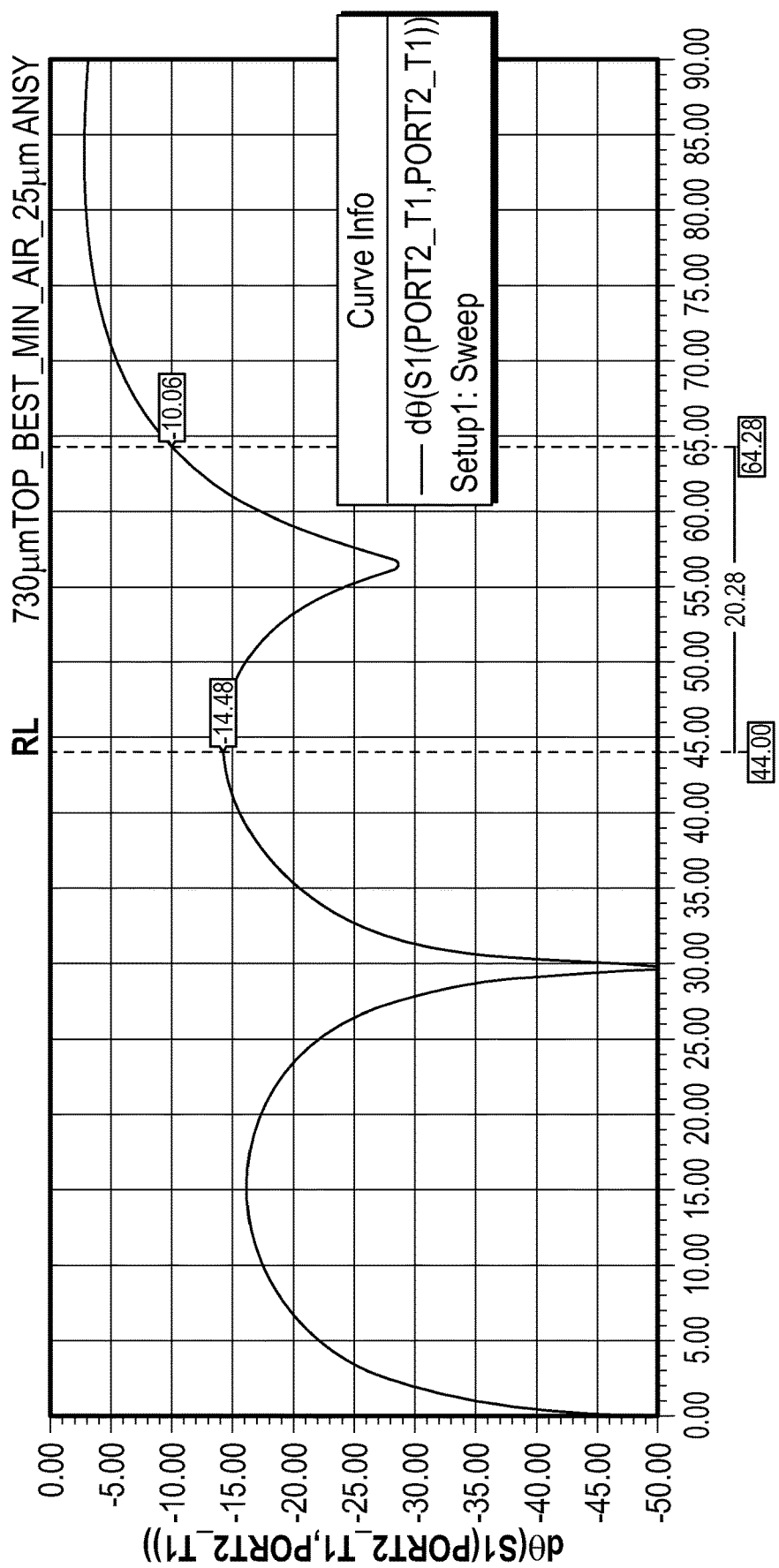
FIG. 8A shows an illustration of a graph of probe return loss (frequency domain plot) in accordance with some embodiments of the present disclosure.
Figure 8B:
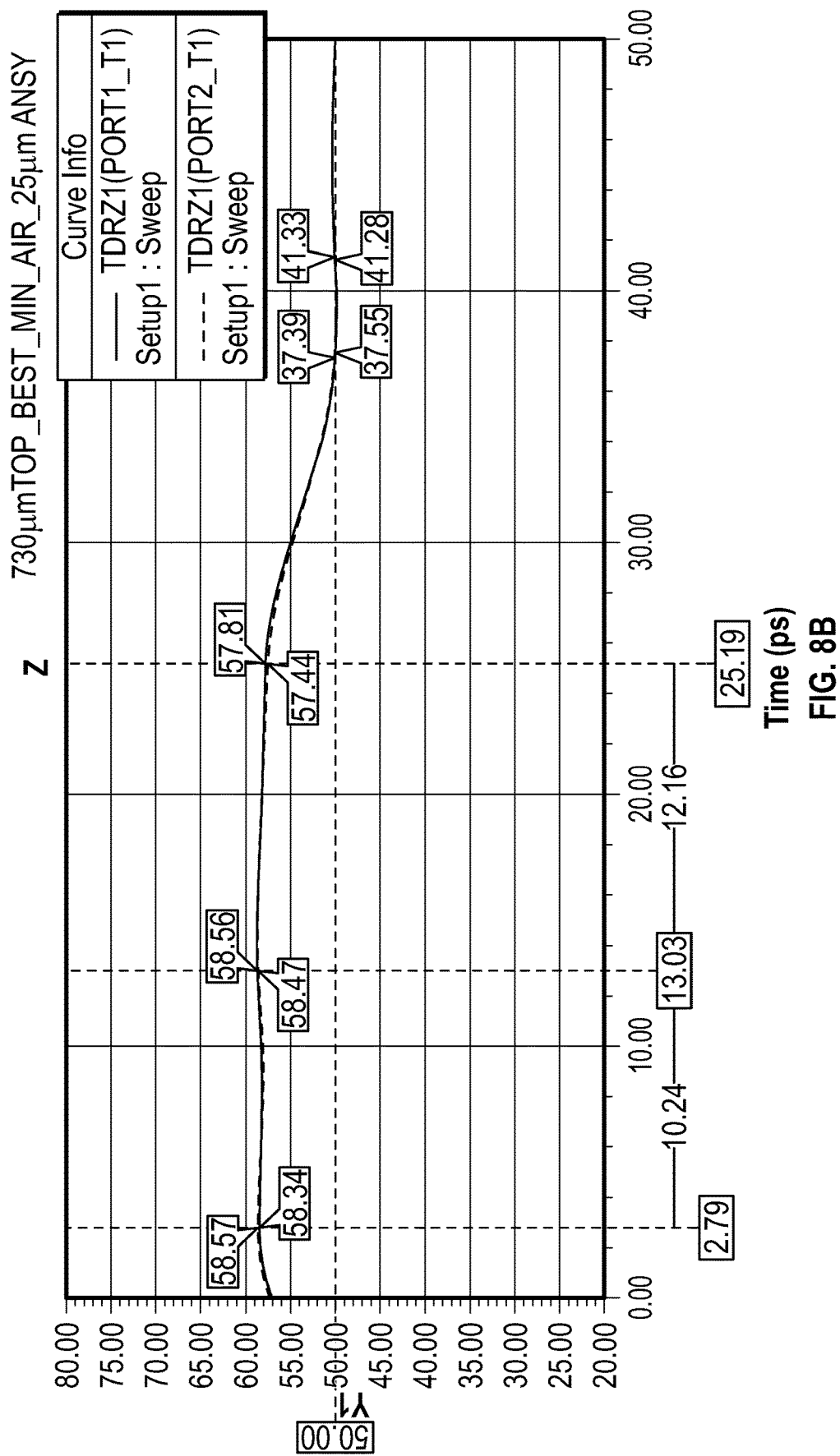
FIG. 8B shows an illustration of a graph of probe impedance (time domain plot) in accordance with some embodiments of the present disclosure.

FIG. 8A shows an illustration of a graph of probe return loss (frequency domain plot) in accordance with some embodiments of the present disclosure. FIG. 8B shows an illustration of a graph of probe impedance (time domain plot) in accordance with some embodiments of the present disclosure. As can be seen in FIG. 8A and FIG. 8B, the calculated time domain impedance response appears to be high for 50 ohms, however, the unexpected return loss seen by the contactor provides improved performance at a higher frequency than a current contactor design.

Figure 9:
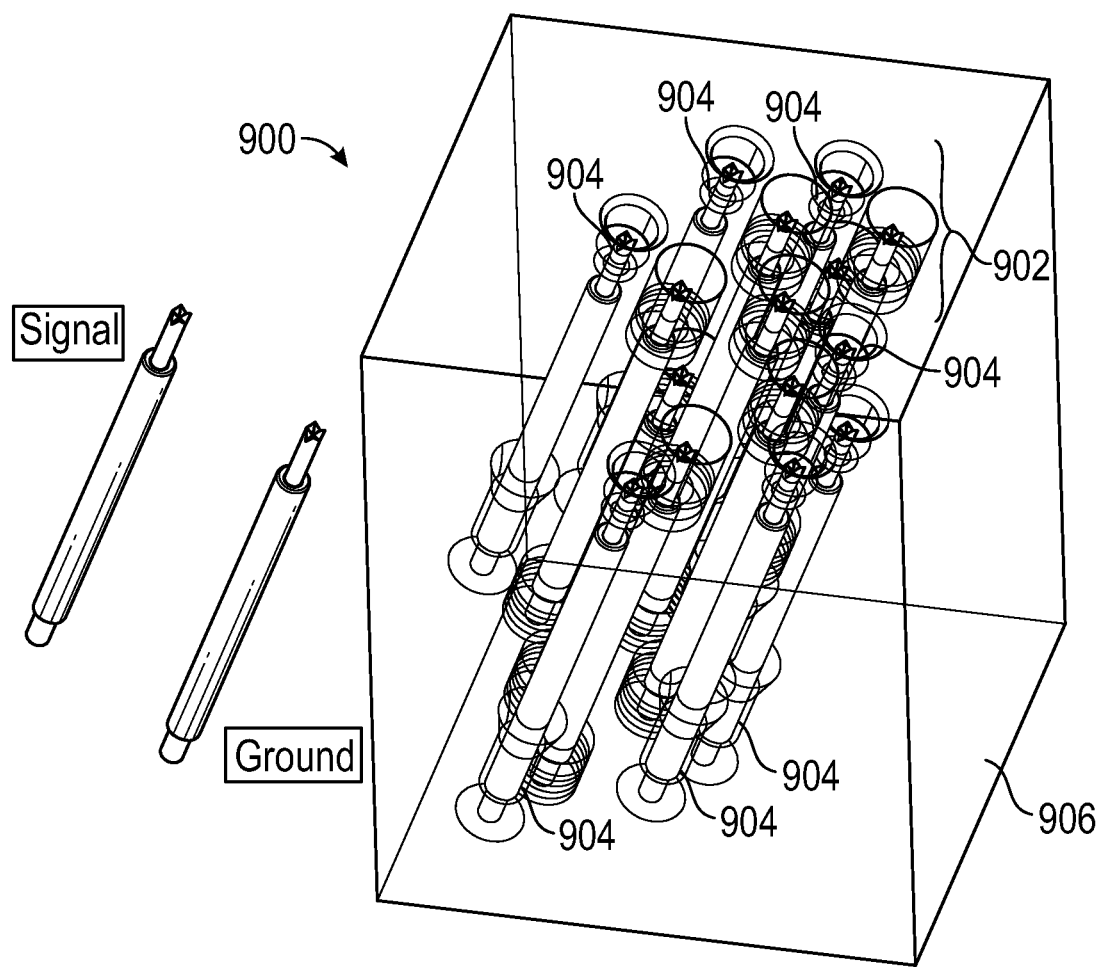
FIG. 9 shows an illustration of signal pins and ground pins embedded in a dielectric for an exemplary contactor in accordance with some embodiments of the present disclosure.

FIG. 9 shows an illustration of signal pins 902 and ground pins 904 embedded in a dielectric 906 for an exemplary contactor 900 in accordance with some embodiments of the present disclosure. The pitch (distance between signal pins 902 and ground pins 904) is not limited to a particular value. The height of the signal pins 902 (distance from one end of the pin to the other) and the ground pins 904 (distance from one end of the pin to another) is not limited to a particular value.

Figure 10:
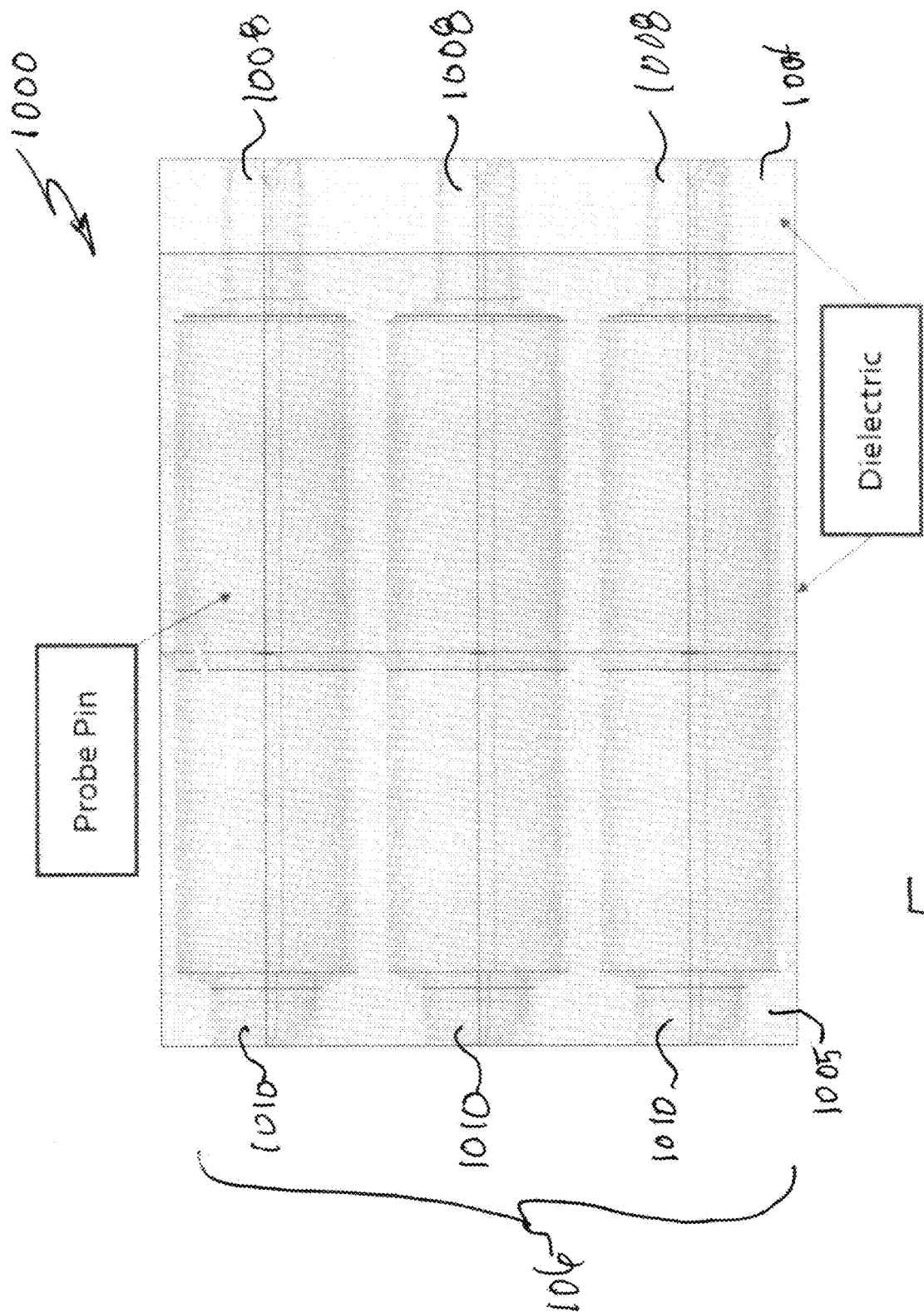
FIG. 10 shows an illustration of a test contactor including two or more dielectric layers and a test probe embedded in the two or more dielectric layers in accordance with some embodiments of the present disclosure.

FIG. 10 shows an illustration of a test contactor 1000 including one or more dielectric layers, dielectric layer 1004 and dielectric layer 1005, and a test probe 1006 embedded in the one or more dielectric layers in accordance with some embodiments of the present disclosure. The test probe 1006 embedded in the one or more dielectric layers and traversing the one or more dielectric layers, the test probe 1006 to include an input signal port 1008 and an output signal port 1010 and the test probe 1006 to transmit a test signal from the input signal port 1008 to the output signal port 1010. In some embodiments, one of the one or more dielectric layers includes a material having a low dielectric constant. In some embodiments, the test probe 1006 includes a ground-signal probe contact configuration. In some embodiments, one of the one or more dielectric layers includes a material having a medium or high dielectric constant. In some embodiments, the test probe 1006 includes a ground-signal probe contact configuration. The cross-section of the pins in the probe including both the barrels and the plungers are selected to achieve the desired impedance of the test contactor 1000.

The stack-up of the test contactor 1000 is related to the frequency of interest (frequency=1/wavelength). The thickness and order of dielectric layer stack-up includes one or more dielectric layers. The reference equation $f\_resonance=1/(2\pi\sqrt{LC})$ is used in the design of the test contactor 1000. As used herein, f_resonance is the center frequency of the interested band, and L and C are the parasitic inductance and capacitance in the contactor signal path. Through adjusting dielectric material and dielectric layer stack-up, the resonance frequency, contactor frequency bandwidth and probe inductance are determined.

Figure 11:
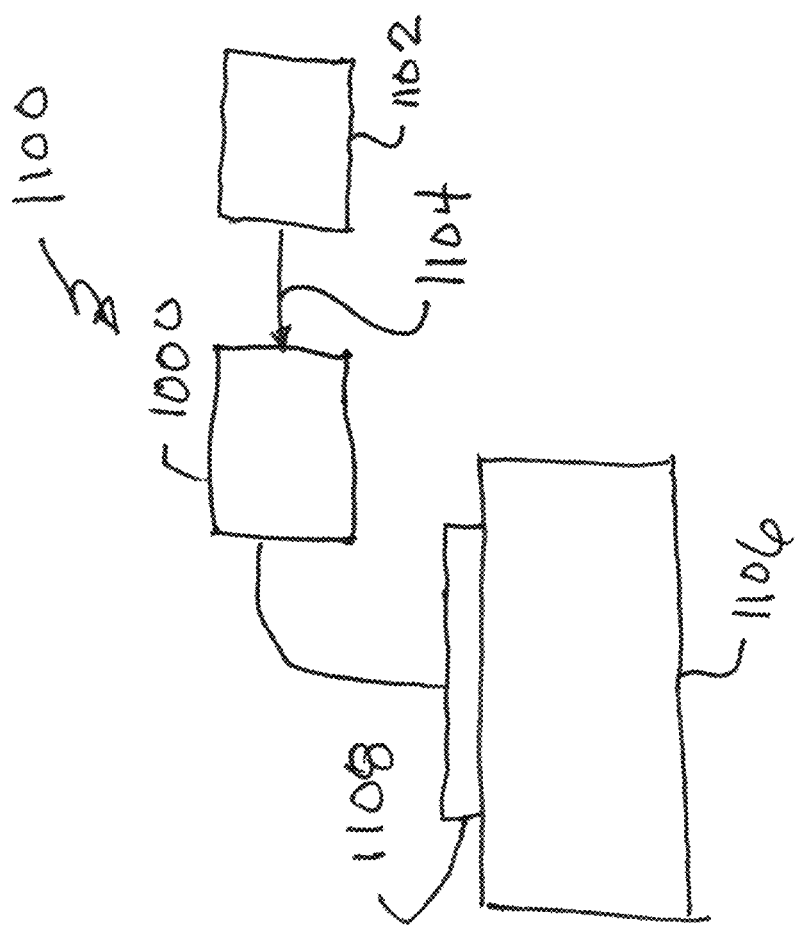
FIG. 11 shows a system for testing an integrated circuit in accordance with some embodiments of the present disclosure.

FIG. 11 shows a system 1100 for testing an integrated circuit in accordance with some embodiments of the present disclosure. The system 1100 includes a test signal source 1102 to provide a test signal 1104, a test station 1106 for mounting the integrated circuit 1108 or other device under test, and a test contactor 1000. In operation, in some embodiments, the test contactor 1000, as shown in FIG. 9, transmits the test signal 1104 from the test signal source 1102 to the integrated circuit 1108. In some embodiments, the test signal source is configured to receive a signal from the integrated circuit 1108.

Figure 12:
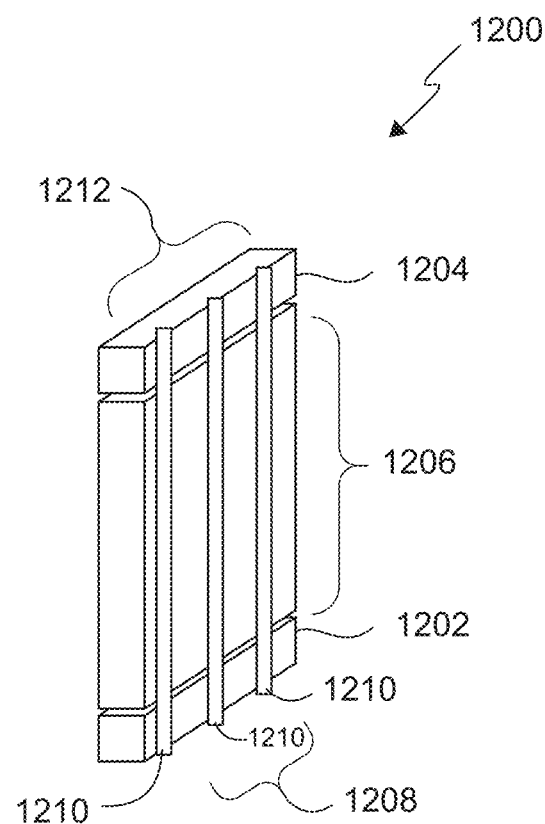
FIG. 12 shows a schematic illustration of a test contactor including a first plate, a second plate, one or more dielectric layers and a test probe embedded in the first plate, the second plate, and the one or more dielectric layers in accordance with some embodiments of the present disclosure.

FIG. 12 shows a schematic illustration of a test contactor 1200 including a first plate 1202, a second plate 1204, one or more dielectric layers 1206 and a test probe 1208 embedded in the first plate 1202, the second plate 1204, and the one or more dielectric layers 1206 in accordance with some embodiments of the present disclosure. The one or more dielectric layers 1206 are formed between the first plate 1202 and the second plate 1204. The test probe 1208 traverses the first plate 1202, the one or more dielectric layers 1206, and the second plate 1204. The test probe 1208 to include an input signal port 1210 and an output signal port 1212 and the test probe 1208 to transmit a test signal from the input signal port 1210 to the output signal port 1212. In some embodiments, the one of the one or more dielectric layers 1206 includes a material having a low dielectric constant. In some embodiments, the test probe 1208 includes a ground-signal-ground probe contact configuration. In some embodiments, the one or more dielectric layers 1206 is the dielectric stack 102 (shown in FIG. 1A). In some embodiments, the first plate 1202 is a probe retention plate. In some embodiments, the second plate 1204 is a probe alignment plate.

In some embodiments, a design process for a contactor including two or more dielectric layers and having a contactor radio frequency performance, given a radio frequency performance design goal, includes selecting a hole diameter for a probe traversing the two or more dielectric layers and stopping the design process if the contactor radio frequency performance meets the radio frequency performance design goal, selecting a new material and a new thickness for one of the two or more dielectric layers and stopping the design process if the contactor radio frequency performance meets the radio frequency performance design goal, and adding a new dielectric layer to the contactor, the new dielectric layer having a new dielectric layer dielectric constant and a new dielectric layer thickness, and stopping the design process if the radio frequency performance of the contactor meets the radio frequency performance design goal.

Reference throughout this specification to "an embodiment," "some embodiments," or "one embodiment." means that a particular feature, structure, material, or characteristic described in connection with the embodiment is included in at least one embodiment of the present disclosure. Thus, the appearances of the phrases such as "in some embodiments," "in one embodiment," or "in an embodiment," in various places throughout this specification are not necessarily referring to the same embodiment of the present disclosure. Furthermore, the particular features, structures, materials, or characteristics may be combined in any suitable manner in one or more embodiments.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A test contactor comprising:
   a stack of dielectric layers comprising three or more dielectric layers, wherein a middle dielectric layer interposed between two outer dielectric layers has a dielectric constant that is lower than dielectric constants of the two outer dielectric layers, and wherein one or both of the outer dielectric layers have a dielectric constant of 3-6; and
   a test probe embedded in the stack of dielectric layers and traversing the stack of dielectric layers, the test probe including an input signal port configured to electrically contact a test signal source and an output signal port configured to electrically contact an integrated circuit device to transmit a test signal from the test signal source through the input signal port to the integrated circuit device through the output signal port.

2. The test contactor of claim 1, wherein the middle dielectric layer has a lower dielectric constant of 1-3, and wherein a distance between the two outer dielectric layers is between about one-eighth and about seven-eighths of a wavelength of the test signal.

3. The test contactor of claim 2, wherein the test probe includes a ground-signal probe contact configuration.

4. The test contactor of claim 1, wherein the test contactor has a return loss that is down 10 dB at about eighty-nine gigahertz.

5. A system for testing an integrated circuit, the system comprising:
 a test signal source to provide a test signal;
 a test station for mounting the integrated circuit;
 a test contactor comprising:
  a stack of dielectric layers comprising three or more dielectric layers, wherein a middle dielectric layer interposed between two outer dielectric layers has a dielectric constant that is lower than dielectric constants of the two outer dielectric layers; and
  a test probe embedded in the stack of dielectric layers and traversing the stack of dielectric layers, the test probe including an input signal port configured to electrically contact a test signal source and an output signal port configured to electrically contact an integrated circuit to transmit the test signal from the test signal source through the input signal port to the integrated circuit device through the output signal port,
  wherein a distance between the two outer dielectric layers is between about one-eighth and about seven-eighths of a wavelength of the test signal.

6. The test system of claim 5, wherein one or both of the outer dielectric layers have a dielectric constant of 3-6, and wherein the middle dielectric layer has lower dielectric constant of 1-3.

7. The system for testing an integrated circuit of claim 5, wherein the test contactor has an eye signal-to-noise ratio at least about 59.

8. A test contactor comprising:
 a dielectric stack including:
  a first dielectric layer;
  a second dielectric layer; and
  a third dielectric layer located between the first dielectric layer and the second dielectric layer and having a dielectric constant that is lower than dielectric constants of the first and second dielectric layers; and
 a test probe embedded in the dielectric stack and traversing the dielectric stack from the first dielectric layer to the second dielectric layer, the test probe to include an input signal port and an output signal port and the test probe to transmit a test signal from the input signal port to the output signal port,
 wherein a distance between the first dielectric layer and the second dielectric layer is between about one-eighth and about seven-eighths of a wavelength of the test signal.

9. The test contactor of claim 8, wherein the first dielectric layer includes a first dielectric material having a first dielectric constant, the second dielectric layer includes a second dielectric material having a second dielectric constant of 3-6, and the third dielectric layer includes a third dielectric material having a third dielectric constant of 1-3.

10. The test contactor of claim 9, wherein the first dielectric constant is 3-6.

11. The test contactor of claim 8, wherein the test contactor has a ten-to-ninety percent rise time of less than about 8 picoseconds.

12. A test contactor comprising:
 a dielectric stack including:
  a first dielectric layer;
  a second dielectric layer; and
  a third dielectric layer located between the first dielectric layer and the second dielectric layer; and
  a test probe embedded in the dielectric stack and traversing the dielectric stack from the first dielectric layer to the second dielectric layer, the test probe to include an input signal port and an output signal port and the test probe to transmit a test signal from the input signal port to the output signal port;
 a fourth dielectric layer located between the first dielectric layer and the third dielectric layer; and
 a fifth dielectric layer located between the second dielectric layer and the third dielectric layer, wherein a distance between the first dielectric layer and the second dielectric layer is between about one-eighth and about seven-eighths of a wavelength of the test signal.

13. A test contactor comprising:
 a dielectric stack including:
  a first dielectric layer;
  a second dielectric layer; and
  a third dielectric layer located between the first dielectric layer and the second dielectric layer; and
  a test probe embedded in the dielectric stack and traversing the dielectric stack from the first dielectric layer to the second dielectric layer, the test probe to include an input signal port and an output signal port and the test probe to transmit a test signal from the input signal port to the output signal port;
 a fourth dielectric layer located between the first dielectric layer and the third dielectric layer; and
 a fifth dielectric layer located between the second dielectric layer and the third dielectric layer, wherein a distance between the first dielectric layer and the second dielectric layer is between about one-eighth and about seven-eighths of a wavelength of the test signal, wherein the fourth dielectric layer includes a material having a low dielectric constant.

14. A test contactor comprising:
 a dielectric stack including:
  a first dielectric layer;
  a second dielectric layer; and
  a third dielectric layer located between the first dielectric layer and the second dielectric layer; and
  a test probe embedded in the dielectric stack and traversing the dielectric stack from the first dielectric layer to the second dielectric layer, the test probe to include an input signal port and an output signal port and the test probe to transmit a test signal from the input signal port to the output signal port;
 a fourth dielectric layer located between the first dielectric layer and the third dielectric layer; and
 a fifth dielectric layer located between the second dielectric layer and the third dielectric layer, wherein a distance between the first dielectric layer and the second dielectric layer is between about one-eighth and about seven-eighths of a wavelength of the test signal, wherein the fourth dielectric layer includes a material having a low dielectric constant and wherein the third dielectric layer includes a material having a medium or high dielectric constant.

15. A test contactor comprising:
 a first plate comprising a probe retention plate;
 a second plate comprising a probe alignment plate;
 three or more dielectric layers formed between the first plate and the second plate, wherein a middle dielectric layer interposed between two outer dielectric layers has a dielectric constant that is lower than dielectric constants of the two outer dielectric layers; and a test probe embedded in the first plate, the test probe embedded in the three or more dielectric layers, and the test probe embedded in the second plate and the test probe traversing the first plate, the three or more dielectric layers, and the second plate, the test probe including an input signal port configured to electrically contact a test signal source and an output signal port configured to electrically contact an integrated circuit device to transmit a test signal from the test signal source through the input signal port to the integrated circuit device through the output signal port, wherein a distance between the two outer dielectric layers is between about one-eighth and about seven-eighths of a wavelength of the test signal.

16. A test contactor comprising:

a first plate;

a second plate;

one or more dielectric layers formed between the first plate and the second plate; and a test probe embedded in the first plate, the test probe embedded in the one or more dielectric layers, and the test probe embedded in the second plate and the test probe traversing the first plate, the one or more dielectric layers, and the second plate, the test probe to include an input signal port and an output signal port and the test probe to transmit a test signal from the input signal port to the output signal port, wherein one of the one or more dielectric layers includes a material having a low dielectric constant, wherein the one or more dielectric layers includes three dielectric layers and the three dielectric layers have a distance of between about one-eighth and about seven-eighths of a wavelength of the test signal.

17. The test contactor of claim 16, wherein the test probe includes a ground-signal-ground probe contact configuration.

* * * * *